United States Patent [19]
Breger

[11] Patent Number: 6,137,310
[45] Date of Patent: Oct. 24, 2000

[54] SERIAL SWITCH DRIVER ARCHITECTURE FOR AUTOMATIC TEST EQUIPMENT

[75] Inventor: Peter Breger, Calabasas, Calif.

[73] Assignee: Teradyne, Inc., Boston, Mass.

[21] Appl. No.: 09/253,175

[22] Filed: Feb. 19, 1999

[51] Int. Cl.[7] .................................................. H03K 19/00
[52] U.S. Cl. ............................. 326/56; 326/56; 326/57; 326/59; 326/60; 326/33; 326/127
[58] Field of Search .................................. 326/56, 57, 16, 326/18, 33, 59, 60, 127

[56] References Cited

U.S. PATENT DOCUMENTS

| | | |
|---|---|---|
| 4,029,971 | 6/1977 | Pryor . |
| 4,363,978 | 12/1982 | Heimbigner . |
| 4,572,971 | 2/1986 | Necoechea . |
| 4,737,663 | 4/1988 | Varadarajan . |
| 4,998,026 | 3/1991 | King . |
| 5,146,159 | 9/1992 | Lau et al. . |
| 5,146,161 | 9/1992 | Kiser . |
| 5,159,216 | 10/1992 | Taylor et al. . |
| 5,250,860 | 10/1993 | Chu et al. . |
| 5,323,068 | 6/1994 | Freitas . |
| 5,500,817 | 3/1996 | McLaury . |
| 5,578,941 | 11/1996 | Sher et al. ................................. 326/34 |
| 5,602,498 | 2/1997 | Satoh et al. ............................. 326/126 |
| 5,610,539 | 3/1997 | Blauschild et al. ..................... 326/127 |
| 5,644,258 | 7/1997 | Wu . |
| 5,714,892 | 2/1998 | Bowers et al. . |
| 5,852,364 | 12/1998 | Whetsel .................................... 326/16 |
| 5,900,744 | 5/1999 | Bisen et al. ............................... 326/58 |

*Primary Examiner*—Michael Tokar
*Assistant Examiner*—Viboi Tan
*Attorney, Agent, or Firm*—Lance Kreisman

[57] ABSTRACT

A tristate circuit for driving three signal levels to a pin of a device-under-test is disclosed. The tristate circuit includes a driver having an output at a first signal level and adapted for coupling to the pin. A first switching unit couples to the output and responds to a programmed signal. The first switching unit operates to selectively alter the first signal level to a second signal level. A second switching unit connects serially to the first switch. The second switching unit responds to a second programmed signal and operates to cooperate with the first switch to alter the second signal level to a third signal level.

18 Claims, 2 Drawing Sheets

SERIAL SWITCH DRIVER ARCHITECTURE FOR AUTOMATIC TEST EQUIPMENT

FIELD OF THE INVENTION

The invention relates generally to automatic test equipment for testing semiconductor devices, and more particularly a serial switch driver for use in a semiconductor tester to test logic devices.

BACKGROUND OF THE INVENTION

Manufacturers of semiconductor devices routinely test their products at the wafer and packaged-device levels. The testing is usually carried out by a sophisticated system commonly referred to as automatic test equipment. The equipment generally drives waveforms to and detects outputs from one or more devices-under-test (DUT). The detected outputs are then compared to expected values to determine whether the device functioned properly.

Many logic devices include I/O pins that require three distinct voltage levels. Consequently, in order to test the full capabilities of such a device, semiconductor manufacturers often require the test equipment to have the capability of driving tristate waveforms to simulate the voltage levels. This capability, when provided, resides in the driver architecture for each channel that corresponds to a particular pin of the DUT.

Conventional driver architectures employed in automatic test equipment are usually designed on application specific integrated circuits (ASICs) that form part of the pin electronics for coupling to the DUT pins. The ASICs typically utilize bipolar, MOS, or GaAs technologies due to the high device densities achievable.

One conventional driver architecture that employs bipolar technology, illustrated in FIG. 1, is employed in the J973 Magnum tester, manufactured by Teradyne Inc., of Agoura Hills, Calif. The conventional architecture comprises a Class A switch configuration that pulls a variable current out of a buffer amplifier 10 to change the voltage level at the output $V_{OUT}$. The buffer amplifier includes internal circuitry for generating a "high" voltage level Vh and an output resistance represented by resistor R1 (typically 50 ohms). A parallel network of differential pair switches 12 and 16 are coupled to the output and include respective programmable current sources (sinks) 14 and 18 to selectively draw current out of the buffer amplifier. The switches include respective pairs of complementary transistors Q1, Q2, and Q3, Q4 that activate in response to complementary logic signals A*, A, and B*, B.

An operational characteristic of a Class A driver is the constant operation of the programmable current sources I1 and I2. Typically, the current sources are programmed to sink specific currents to effect a desired voltage drop across R1, and achieve the desired voltage at VOUT. For the architecture illustrated in FIG. 1, the relationship for programming I1 is often (Vh-Vl)/R1, and for I2 the relationship is (Vh-Vt)/R1. Operating with the following parameters: Vh=2V, Vt=1V, Vl=0V, R1=50 ohms, VCC=7 volts and VEE=-6 volts, the respective currents for I1 and I2 correspond to 40 milliamps and 20 milliamps, respectively.

In operation, the parallel network of switches 12 and 16 responds to the timed logic signals A, A* and B, B* to activate and deactivate the proper transistors to produce the desired tristate waveform at the output VOUT. FIG. 2 illustrates a timing diagram regarding the sequencing of the transistors Q1–Q4 to achieve the tristate waveform 20. To set the output to Vh (2 volts), transistors Q2 and Q4 are deactivated while Q1 and Q3 are activated by the complementary logic signals A* and B*. As a result, the current out of the buffer 10 is minimized with little voltage drop across R1, placing VOUT at Vh (2 volts). Activating Q4 with logic signal B, and deactivating Q3 with signal B*, causes the second switch 16 to draw 20 milliamps of current out of the buffer 10 corresponding to the programmed level of current source I2. As a result, the output voltage drops to Vt (1 volt). To achieve the third voltage level Vl at the output VOUT, Q4 is switched off while Q2 simultaneously switches on, causing I2 to draw 40 mA across R1, and dropping VOUT to 0 volts.

While the conventional parallel switch driver architecture works well for its intended purposes, those skilled in the art have observed inaccuracies during the output transition of VOUT from Vt to Vl. The reason for the inaccuracy lies in the difficulty in simultaneously deactivating Q4 while activating Q2. Should Q4 turn off before Q2 turns on, as shown in FIG. 2, a "preshoot" 22 occurs that creates a ringing disturbance in the signal channel, requiring time to allow the disturbance to return to a steady state. This undesirably affects the accuracy of the tristate waveform, and indirectly reduces the effective speed of the tester.

Another problem with the conventional parallel architecture described above involves the power consumed during operation. As noted above, Class A drivers continuously maintain operation of the current sources I1 and I2. In the example above, current is always drawn by the sources, whether from the VCC rail (typically 7 volts), or the buffer amplifier 10. Consequently, the continuous total current sums to 60 milliamps, with a corresponding power consumption of 60 mA*13V=780 milliwatts. In some circumstances, tester users set Vl to Vt. As a result, the respective programmed currents drawn by I1 and I2 out of the buffer are both relatively high (often about 40 milliamps each), and consuming power on the level of about 80 mA*13V=1040 mW. These levels of power consumption are undesirable in many applications.

What is needed and heretofore unavailable is a tristate driver architecture for automatic test equipment having the capability of minimizing any preshoot transients during state transitions. Moreover, the need exists for a driver architecture that consumes minimal power during operation. The serial switch driver architecture of the present invention satisfies these needs.

SUMMARY OF THE INVENTION

The serial switch driver architecture of the present invention provides the capability of delivering a tristate waveform to a pin of a device-under-test with high accuracy while minimizing the power consumed during operation. Such advantages improve the reliability and throughput of a tester to substantially reduce the costs in testing semiconductor devices.

To realize the foregoing advantages, the invention in one form comprises a tristate circuit for driving three signal levels to a pin of a device-under-test. The tristate circuit includes a driver having an output at a first signal level and adapted for coupling to the pin. A first switching unit couples to the output and responds to a programmed signal. The first switching unit operates to selectively alter the first signal level to a second signal level. A second switching unit connects serially to the first switch. The second switching unit responds to a second programmed signal and operates to cooperate with the first switch to alter the second signal level to a third signal level.

In another form, the invention comprises a tristate circuit for use in an integrated circuit to drive three voltage levels to a pin of a device-under-test. The tristate circuit includes a driver comprising a buffer amplifier powered by a voltage source and having an output resistance. The voltage source operates at a programmable voltage defining a high voltage level and has an output adapted for coupling to the pin. A first switching unit couples to the output and comprises a first current pulling network. The network defines a first current path and responds to a programmed signal to selectively alter the high voltage level to a mid-voltage level by drawing a first predetermined current out of the driver along the first current path. A second switching unit couples serially to the first switching unit and comprises a second current pulling network defining a second current path. The second current pulling network responds to a programmed signal to selectively alter the mid-voltage level by drawing a second predetermined current out of the driver along the first current path, and continuing along the second current path.

In yet another form, the invention comprises a method of switching the output signal level from a driver according to a predetermined tristate waveform to minimize transition transients. The method includes the steps of: utilizing the first signal level as a first state for the tristate waveform; drawing a predetermined first current from the driver along a first current path to reduce the output to a second signal level defining a second state for the tristate waveform; and pulling a predetermined second current from the driver along the first current path and through a second current path disposed serially with the first path to reduce the output to a third signal level defining a third state for the tristate waveform.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
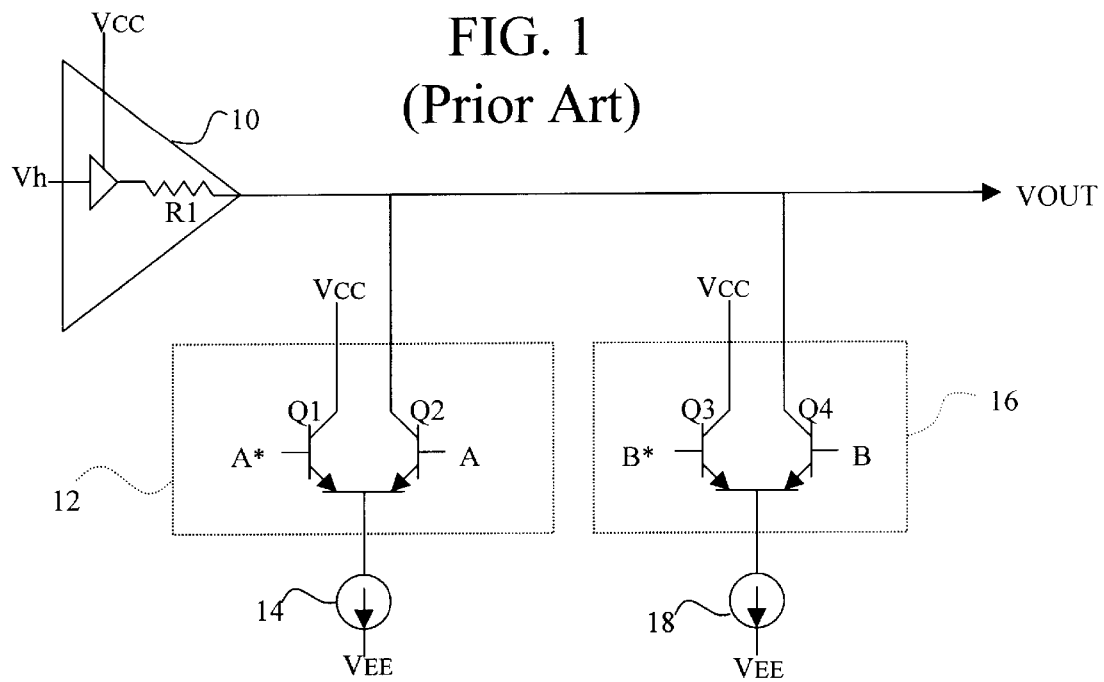
FIG. 1 is a schematic of a tristate driver of conventional construction.
Figure 2:
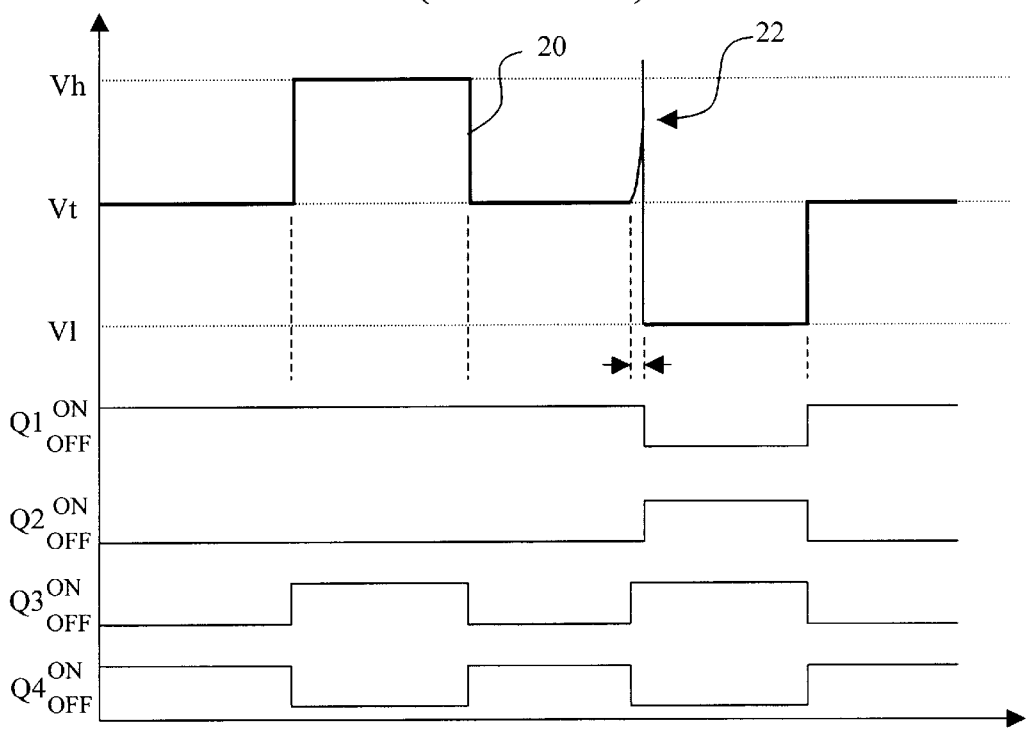
FIG. 2 is a timing diagram illustrating the sequencing of the conventional tristate driver of FIG. 1.
Figure 3:
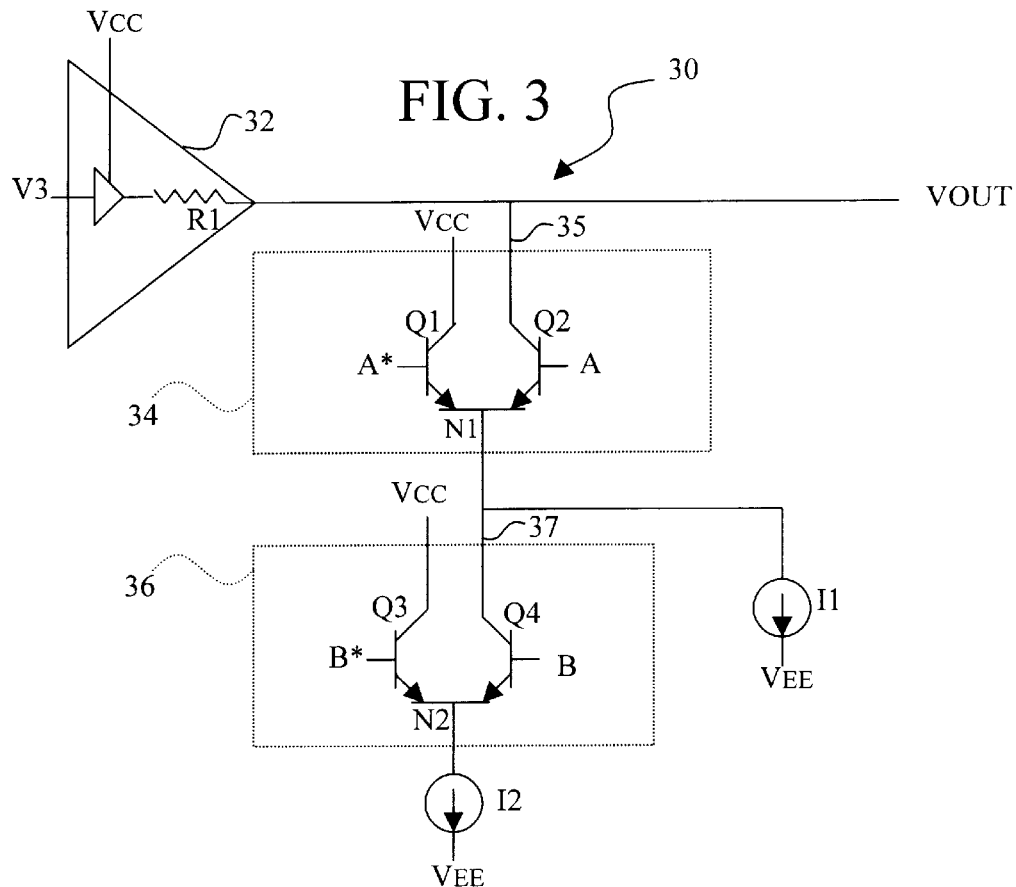
FIG. 3 is a schematic of a tristate driver according to one embodiment of the present invention.

Referring now to FIG. 3, the serial switch driver architecture of the present invention, generally designated 30, includes a driver 32 and a pair of serially connected switching units 34 and 36. The serial switch construction minimizes any "preshoots" during output state transitions and consumes minimal power during operation.

Further referring to FIG. 3, the driver 32 comprises a buffer amplifier of known construction that includes circuitry to programmably generate a "high" voltage level V3. The buffer includes an output resistance represented by resistor R1, usually 50 ohms.

The first switching unit 34 shunts the output VOUT to form a first selectable current path, at 35. In a preferred embodiment, the first switching unit is configured with an electronic switch comprising a differential pair and includes a complementary pair of bipolar-junction-transistors (BJTs) Q1 and Q2 with respective emitters joined at node N1, and respective bases for receiving complementary inputs A and A*. The collector of Q2 forms the shunt to the output VOUT. A first programmable current source I1 couples to node N1 to draw a first programmed current through the differential pair (either through Q1 and out of the power rail Vcc, or through Q2 and out of the buffer 32). The current drawn by the first current source is programmed according to the relationship (V3–V2)/R1, where V2 represents a mid-level voltage.

With continued reference to FIG. 3, the second switching unit 36 couples to the first node N1 to establish a second current path, at 37, and placing the second switching unit in a series relationship with the first switching unit 34. Like the first switching unit, the second switching unit preferably includes an electronic switch comprising a differential pair of transistors Q3 and Q4 constructed similarly to Q1 and Q2. The inputs to Q3 and Q4 respond to logic signals B and B* applied at the respective bases. The commonly joined emitters of Q3 and Q4 form a second node N2. A second programmable current source I2 couples to node N2. The second current source is programmed to draw current according to the relationship (V2-V1)/R1 that, when summed with the current from the first source I1, pulls the output VOUT to a low level V1.

The serial switch driver 30 of the present invention is adapted to couple to the pin of a device-under-test (DUT) (not shown). Prior to testing the DUT, the high voltage level V3 is programmed, along with the respective current sources I1 and I2 to draw current levels out of the buffer in order to change the output from V3 to the other desired levels for V2 and V1. The user also programs the timing of logic signals A, A*, and B, B* to activate the specific transistors Q1–Q4 at precise times, thereby defining the tristate waveform transitions, or edges. The accuracy of the actual edge placement versus the programmed placement is an important factor in successfully carrying out a test on a logic device.

The voltage level conventions associated with the serial switch architecture of the present invention follow the relationship V3>V2>V1. In a majority of applications, V3 is programmed to a "high" level (Vh), V2 set to a "mid" level (Vt) and V1 mapped to a "low" level (Vl). Under certain circumstances, however, users require the flexibility to set Vt>Vh or Vt<Vl. In such circumstances, a formatter (not shown) recognizes the proper mapping to ensure that V3 is set to the highest level, V2 is set to the mid-level, and V1 set to the low voltage level.

Figure 4:
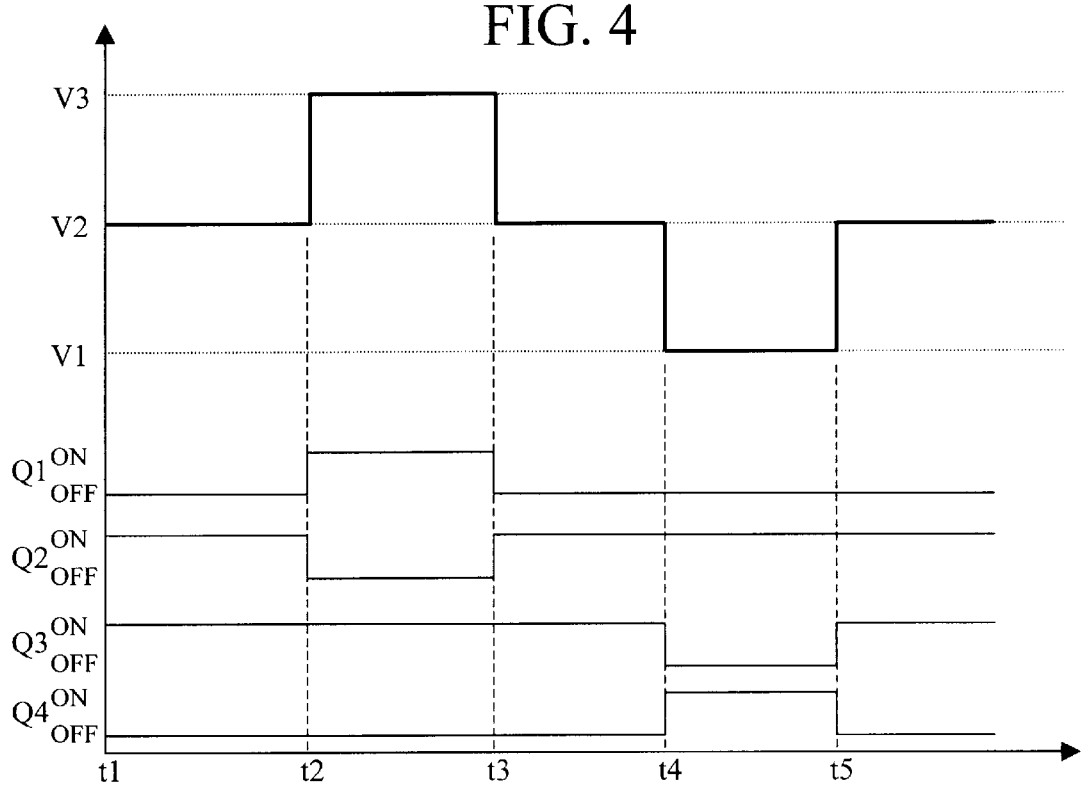
FIG. 4 is a timing diagram illustrating a programmed sequence for the tristate driver shown in FIG. 3.

Operation of the tristate circuit, in one example, proceeds according to the timing diagram shown in FIG. 4. In this example, V3 is programmed to 2 volts, with the desired voltage levels for V2 and V1 corresponding to 1 volt and 0 volts, respectively. In order to pull VOUT to the desired levels for V2 and V1, the respective current sources I1 and I2 are programmed to each draw 20 milliamps of current out of the buffer 32. For example, current source I1 is programmed to draw a first current out of the buffer according to the relationship (V3–V2)/50=20 milliamps. Likewise, current source I2 is programmed to pull a second current out of the buffer amplifier, summed with the first current, according to the relationship (V2-V1)/50=20 milliamps.

Further referring to FIG. 4, at time I1, transistor Q2 is activated by the application of logic signal A at its base, while transistor Q1 simultaneously deactivates. As a result, the first current path to the buffer 32 is established, resulting in a 20 mA current being pulled out of the buffer 32. This drops voltage V3 (2 volts) across load R1 (50 ohms) to the mid-level voltage V2 (1 volt). At time t2, transistor Q2 turns off, eliminating any conduction along the first current path, and Q1 activates, causing source I1 to draw current from the power rail Vcc. Assuming a high input impedance at the DUT pin (not shown), minimal current flows through R1, such that the output VOUT follows the high level voltage V3. At t3, transistors Q1 and Q2 again switch states as described above to reduce the circuit output VOUT to V2.

With continued reference to FIG. 4, at time t4, transistor Q2 remains in an operative state, while transistor Q4 turns on. The additional current (20 mA) conducting through Q4 and drawn by the current source I2 sums with the 20 mA current from I1 to draw a total of 40 mA from the buffer amplifier 32, and to correspondingly pull the output VOUT to V1 (0 volts). Because of the preactivation of the first current path established by Q2, the transition from V2 to V1 occurs without any preshoot problem. By eliminating any preshoot disturbances, the resulting transitioning edge is highly accurate. Turning Q4 off, at time t5, returns the circuit output VOUT to the V2 state.

In certain circumstances, users may need to program the tristate waveform to transition from V3 to V1. An additional feature of the present invention is the ability of carrying out such a transition at high accuracy without the necessity of activating both transistors Q2 and Q4 simultaneously. This is because any conduction along the second current path defined by transistor Q4 necessarily relies on the conduction of current through the first current path. Thus, in one case, transistor Q4 may be programmed to turn on before transistor Q2 activates, without any affect on VOUT until Q2 activates. In this example, any transient effects from Q4 would be negligible since the current through Q4 would have settled by the time Q2 activates. Additionally, the relative timing for Q2 and Q4 may be less precise, but resulting in greater timing accuracy.

Those skilled in the art will appreciate that in addition to the desirable high-accuracy features described above, the serial switch architecture consumes substantially less power during operation than previously achieved by conventional parallel architectures. While the respective first and second current sources always consume power, consistent with the requirement of a Class A driver, the programmed currents from the current sources I1 and I2 are individually minimized and configured to cooperatively draw a combined current, when possible. As a result, the total power consumed during operation for the specific example above amounts to about 40 mA *13 V=520 MW, an approximately 33% reduction in power consumption as compared to conventional parallel switch architectures. This allows valuable power resources to be directed to other circuits in the tester, thereby maximizing power efficiency overall.

Moreover, the serial switch architecture of the present invention lends itself well to implementation in an application specific integrated circuit (ASIC), and will be recognized by those skilled in the art as a unique construction of a Class A switch driver.

While the invention has been particularly shown and described with reference to the preferred embodiments thereof, it will be understood by those skilled in the art that various changes in form and detail may be made therein without departing from the spirit and scope of the invention. For example, while bipolar technology is described in detail herein as a preferred embodiment, it should be understood that other transistor technologies are within the scope of the present invention, including but not limited to MOS-type and GaAs-type technologies.

What is claimed is:

1. A tristate circuit for driving three signal levels to a pin of a device-under-test, said tristate circuit including:
   a driver having an output at a first signal level, said output adapted for coupling to said pin;
   a first switching unit coupled to said output, said first switching unit responsive to a programmed signal and operative to selectively alter said first signal level to a second signal level; and
   a second switching unit connected serially to said first switch, said second switch responsive to a second programmed signal and operative to cooperate with said first switch to alter said second signal level to a third signal level.

2. A tristate circuit according to claim 1 wherein:
   said driver comprises a buffer amplifier having circuitry operative to establish a programmable voltage defining said first signal level.

3. A tristate circuit according to claim 1 wherein said first switching unit comprises a first current-pulling network to draw a first predetermined current out of said driver along a first current path.

4. A tristate circuit according to claim 3 wherein said first current pulling network includes:
   a first electronic switch; and
   a first current source coupled to said first electronic switch in a sink configuration.

5. A tristate circuit according to claim 4 wherein:
   said first current source is programmable to draw a selectable current along said first current path and out of said buffer to drop said output signal level to a second signal level.

6. A tristate circuit according to claim 4 wherein:
   said first electronic switch comprises a pair of bipolar transistors disposed as a differential pair.

7. A tristate circuit according to claim 1 wherein said second switching unit comprises a second current pulling network to draw a second predetermined current out of said driver.

8. A tristate circuit according to claim 7 wherein said second current pulling network includes:
   a second electronic switch; and
   a second current source coupled to said second electronic switch in a sink configuration.

9. A tristate circuit according to claim 8 wherein:
   said second current source is programmable to draw a selectable second current along said first current path to sum with said first current and drop said output signal level to a third signal level.

10. A tristate circuit according to claim 8 wherein:
    said second electronic switch comprises a pair of bipolar transistors disposed as a differential pair.

11. A Class-A switch driver circuit for use in an integrated circuit to drive three voltage levels to a pin of a device-under-test, said tristate circuit including:
    a driver comprising a buffer amplifier having an output resistance, said buffer having circuitry operative to generate a programmable voltage defining a high voltage level and having an output adapted for coupling to said pin;
    a first switching unit coupled to said output, said first switching unit comprising a first current pulling network defining a first current path and responsive to a programmed signal to selectively alter said high voltage level to a mid-voltage level by drawing a first predetermined current out of said driver along said first current path; and a second switching unit coupled serially to said first switching unit, said second switching unit comprising a second current pulling network defining a second current path and responsive to a programmed signal to selectively alter said mid-voltage level by drawing a second predetermined current out of said driver to sum with said first current along said first current path, and continuing along said second current path.

12. A Class-A switch driver circuit according to claim 11 wherein said first current pulling network includes:

a first differential pair of bipolar junction transistors, and a first current source coupled to said emitters.

13. A Class-A switch driver circuit according to claim 12 wherein:

said first current source is programmable to draw a selectable current along said first current path and out of said buffer to drop said output signal level to a second signal level.

14. A Class-A switch driver circuit according to claim 11 wherein said second current pulling network includes:

a second differential pair of bipolar junction transistors; and a second current source coupled to said emitters.

15. A Class-A switch driver circuit according to claim 14 wherein:

said second current source is programmable to draw a selectable second current along said first current path to sum with said first current and drop said output signal level to a third signal level.

16. A method of switching the output signal level from a driver according to a predetermined tristate waveform to minimize transition transients, said driver having circuitry to generate a first signal level, said method including the steps of:

utilizing said first signal level as a first state for said tristate waveform;

drawing a predetermined first current from said driver along a first current path to reduce said output to a second signal level defining a second state for said tristate waveform; and pulling a predetermined second current summed with said first current from said driver along said first current path and through a second current path disposed serially with said first path to reduce said output to a third signal level defining a third state for said tristate waveform.

17. A method according to claim 16 and further including the step of:

deactivating said second current path to return said output to said second signal level.

18. A method according to claim 17 and further including the step of:

deactivating said first current path to return said output to said first signal level.

* * * * *